United States Patent
Samuel et al.

(10) Patent No.: US 6,313,261 B1
(45) Date of Patent: Nov. 6, 2001

(54) POLYMER LIGHT EMITTING DIODE

(75) Inventors: Ifor David William Samuel, Durham; Andrew Paul Monkman, Stanhope, both of (GB); Eymard Gabriel Francois Joseph Rebourt, Saint-Louis (FR); Stuart Dailey, Upton upon Severn (GB)

(73) Assignee: University of Durham, Durham (GB)

( * ) Notice: Subject to any disclaimer, the term of this patent is extended or adjusted under 35 U.S.C. 154(b) by 17 days.

(21) Appl. No.: 09/297,674

(22) PCT Filed: Nov. 7, 1997

(86) PCT No.: PCT/GB97/03019

§ 371 Date: Nov. 10, 1999

§ 102(e) Date: Nov. 10, 1999

(87) PCT Pub. No.: WO98/20565

PCT Pub. Date: May 14, 1998

(30) Foreign Application Priority Data

Nov. 7, 1996 (GB) .................................. 9623204

(51) Int. Cl.$^7$ .................................. C08G 75/00
(52) U.S. Cl. .................. 528/378; 528/423; 428/690; 428/917; 313/1; 313/504; 257/40
(58) Field of Search .................. 528/378, 423; 362/803; 313/1, 504; 257/40, 10; 428/690, 917

(56) References Cited

U.S. PATENT DOCUMENTS 5,247,196 * 9/1993 Friend et al. .................. 257/40
5,723,873 * 3/1998 Yang .................. 257/40

FOREIGN PATENT DOCUMENTS 196 27 071    1/1998  (DE) .
06346051     12/1994  (JP) .

OTHER PUBLICATIONS

"Blue Light Emitting Organic Electroluminescent Device" Applied Phys. Lett. 56(9) 799–801 (1990) Adachi et al.*
Gebler, D.D. et al, "Blue Electroluminescent Devices Based On Soluble Poly(p–pyridine)", Journal of Applied Physics, vol. 78, No. 6, Sep. 15, 1995.
Weaver, M.S., "Recent Progress in Polymers for Electroluminesence: Microcavity Devices and Electron Transport Polymers", Thin Solid Films 273 (1996), pp. 39–47.
Onoda, M., Light Emitting Diodes Using n–Type Conducting Polymer: Poly (p–pyridyl vinylene), Journal of Applied Physics, vol. 78, No. 2, Jul. 15, 1995, pp. 1327–1333.
Dailey, S., "Polypyridine as an Efficient Electron–Transporting Polymer for Light–Emitting Diodes", Dept. Of Physics, Univ. of Durham, U.K.
Holmes, A.B. et al, "Photoluminescence and Electroluminescence in Conjugated Polymeric Systems", Synthetic Metals, 55–57 (1993), pp. 4031–4040.

* cited by examiner

Primary Examiner—Duc Truong
(74) Attorney, Agent, or Firm—Jacobson Holman, PLLC (57) ABSTRACT

Device adapted for efficient light emission including a plurality of component layers of which a first outer layer is adapted for electron injection, a second opposing outer layer is adapted for hole injection, and plural intermediate layers arranged therebetween for charge semi-conduction. The intermediate layers include at least one semi-conducting polymer adapted for hole transport and/or electron blocking, and at least one semi-conducting polymer adapted for hole blocking and/or election transport. The at least one semi-conducting polymer adapted for electron transport and/or hole blocking comprises polymer selected from a nitrogen and/or sulphur containing polymer which is partially or substantially conjugated.

19 Claims, 8 Drawing Sheets

Scheme for photoluminescence

Figure 1. Scheme for photoluminescence

Figure 2. Scheme for electroluminescence

— = current - voltage
△ = intensity - voltage

— = current - intensity

POLYMER LIGHT EMITTING DIODE

The present invention relates to novel polymer light emitting diodes, components and uses thereof, to a process for the production thereof and a method for light emission. More particularly the present invention relates to novel polymer light emitting diodes adapted for enhanced efficiency light emission, novel semi-conducting polymer components and uses thereof in displays and the like, to a process for the production thereof and a method for light emission.

Illuminated displays have been in existence for some years now and are advantageous in a wide range of applications. Nevertheless shortcomings are continually being addressed by development of improved illumination techniques. For example cathode ray tubes are currently in operation in applications where their high power consumption, bulk and weight are acceptable. In less demanding applications liquid crystal displays are employed which operate by reflective rather than light emissive means. Such display technologies suffer problems of limited viewing angle, poor contrast and the like.

Semi-conduction light emitting diodes are known, employing conventional inorganic semi-conducting materials for light emission purpose. These provide an excellent viewing angle and contrast, but limited range of colours. Inorganic semi-conductors are generally crystalline materials leading to complicated manufacture and limited area of devices which may be made from them.

Light emitting diodes (LED's) comprise two electrode layers, respectively a hole injecting layer and an electron injecting layer, typically comprising highly doped semi-conductor, metallic or ionic sheet layers, having an inorganic semi-conductor layer therebetween which serves to conduct holes and electrons to a region between both electrodes at which photon emission occurs.

LEDs however are limited in the range of inorganic semi-conducting materials available and the wave length range of light in which they emit, commonly the infra-red range.

Efforts to modify LEDs by use of conjugated semi-conducting polymers have been made, for example, as disclosed in Holmes A. B. et al Synthetic Metals 55–57 (1993) 4031–4040 "Photoluminescence and electroluminescence in conjugated polymeric systems", however as yet it has not been possible to equal the external quantum efficiencies achieved with inorganic LEDs. A common arrangement employs a singe layer of polyparaphenylenevinylene (PPV) as semi-conducting polymer, which has been found to give an external quantum efficiency defined as number of photons emitted in the form of light detected outside the device, per electron flowing through the device of the order of 0.001% for an aluminium electron injecting contract layer, and of the order of 0.01% for a calcium electron injecting contact layer.

Figure 1:
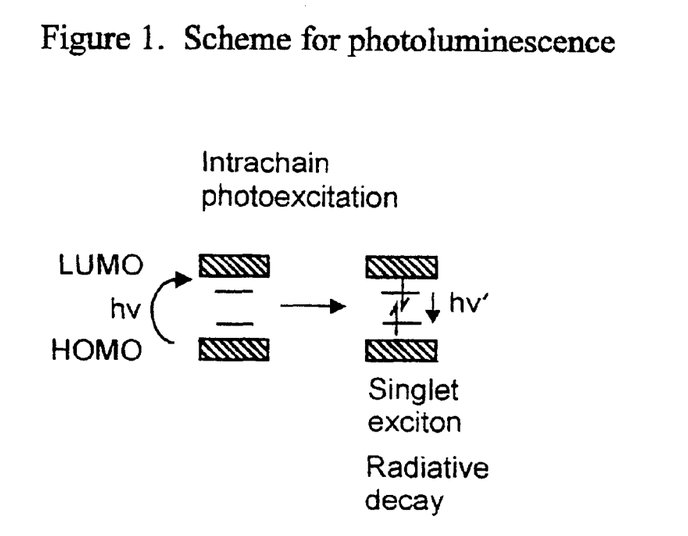
Figure 2:
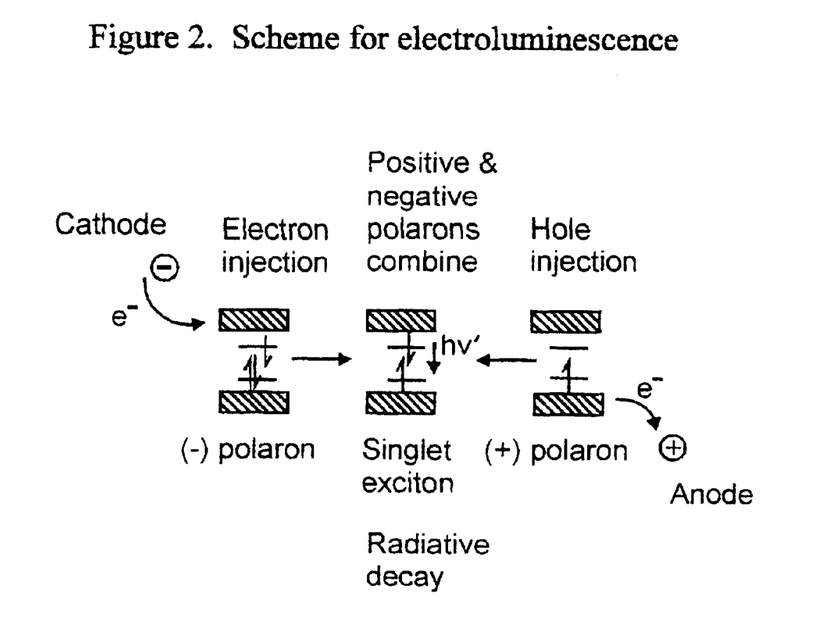

Light emission in organic conjugated polymeric materials may occur by the process of photo luminescence or electro luminescence, as indicated in FIG. 1 and FIG. 2.

It will be apparent that photo luminescence may take place by photo excitation of a polymer, without need for charge conduction, for example photoluminescence has observed for PPV, with emission of light at a longer wavelength (sometimes referred to as the Stokes shift) than that absorbed. Luminescence efficiency by radiative decay of the singlet excition can be reduced by a variety of competing non-radiative decay processes.

Electroluminescence is elcetrically inducded by light emission. In contract to photoluminescence, it results from respective electron and hole injection causing excitation and negative and positive polaron formation. Coincidence of a negative and positive polaron in a luminescent material causes singlet exciton formation with emission of light. Reduced luminescence efficiency may take place as mentioned for photoluminescence, by migration of polarons to a "trap" or "quench" whereby energy is lost-radiatively, or as a result of the proximity of electrodes.

Doping of semi-conducting polymers to improve their semi-conducting behaviour is not wholly successful due to occurrence of phase separation, need for energising the dopant and the like.

Despite the poor efficiency of polymeric LED's, they have highly significant potential advantages in terms of their processability and ability to be deposited over large areas as high quality, robust and/or flexible thin films, for example enabling construction of flexible, very large area LED's, inherent radiative decay properties, emission range covering the whole range of the spectrum, and chemical tailoring of polymer materials to realise desired properties, to name but a few.

According there is a need for an LED and for improved polymeric semi-conductors having the advantages and versatility available with polymeric semi-conductors, however having improved brightness and external quantum efficiencies greater than currently available, for example of the order of 1000 $Cd/m^2$ and 0.5% respectively and more, thereby meeting commercial requirements.

We have now surprisingly found that it is possible to provide a semi-conducting polymer LED meeting these requirements in admirable manner. In particular we have found that in provision of such LEDs, the arrangement of a given semi-conducting material comprised in an LED may determine the overall external quantum efficiency of the LED. Moreover we have found that the semi-conducting ability of certain materials may be improved by careful selection of synthetic techniques.

In a first embodiment of the invention there is provided in its broadest aspect a device adapted for light emission comprising a plurality of component layers of which a first outer layer is adapted for electron injection, a second opposing outer layers is adapted for "hole" injection, and one or more intermediate layers arranged therebetween are adapted for charge semi-conduction wherein the intermediate layer (s) comprise at least one semi-conducting polymer adapted for electron transport and/or hole blocking, and at least one semi-conducting polymer adapted for hole transport and/or electron blocking wherein the at least one semi-conducting polymer adapted for electron transport and/or hole blocking comprises polymer selected from a nitrogen and/or sulphur containing polymer which is partially or substantially conjugated. Preferably the at least one semi-conducting polymer adapted for electron transport and/or hole blocking is selected from a conjugated polycyclic in which at least one nitrogen and/or sulphur is a heteroatom comprised within a conjugated heterocyclic system. By this means the invention provides a mechanism which resembles the balanced injection and balanced transport of electrons and holes. Preferably the device is characterised by an attractive external quantum efficiency, as hereinbefore defined, and an attractive brightness, measured as $Cd/m^2$. Preferably the device comprises intermediate layer(s) comprised of one or more semi-conducting polymers, the type, purity, concentration and layer thickness whereof are adapted for efficient electron and hole transport in relative manner. Preferably the device comprises semi-conducting polymer of chemical and physical nature adapted for electroluminescence, by polaron formation, migration, coincidence and decay in manner that at least one photon of radiation emission is emitted from the device per 400 electrons injected into the device. It is a particular advantage of the invention that the migration and coincidence of electrons and "holes" may be manipulated, whereby a boundary region for coincidence thereof may be positioned relative to the first and second outer layers in an emissive region in manner to provide enhanced brightness and/or external quantum efficiency. Without being limited to this theory, it would seem that the positioning of the boundary region is a function of the respective degrees of transport of electrons and holes within the intermediate layer(s).

Preferably a device of the invention is characterised by an external quantum efficiency of at least 0.1%, more preferably at least 0.2%, most preferably at least 2.0%. Preferably a device of the invention is characterised by a brightness of at least 100 $Cd/m^2$, more preferably at least 500 $Cd/m^2$, most preferably at least 2000 $Cd/m^2$.

Reference herein to a component layer is to a substantially uniform discrete layer of a material, the properties of which are suited to the function of the layer. Accordingly it will be apparent that individual layers are distinguished by nature of component material, which may comprise a plurality of chemical entities present as a physical or chemical mixture.

It will be appreciated that component layers are provided with substantially continuous interface therebetween by suitable means as known in the art, for example by bonding, contact curing and the like with use of co-extrusion, spin or dip coating, electro vacuum deposition process and the like.

Reference herein to semi-conducting layer(s) is to component layers of electron and "hole" transporting materials respectively, present as component layers. These materials favour the transport of negative and positive charge respectively, are also known an n-type and p-type materials. Reference herein to electrons and holes is to negative positive charge carriers respectively, as known in the art, also known as negative and positive polarons.

Reference herein after to a junction is to a boundary region of coincidence of negative and positive charge carriers as hereinbefore defined.

Preferably a junction comprises a substantially continuous planar region through the device of the invention, substantially co-planar with the component layers thereof. The junction is preferably of uniform thickness. The junction may coincide with the interface between component layers or may be comprised within one, or bridging two, component layers. Preferably the junction coincides with or bridges the interface between two semi-conducting layers which are of different charge semi-conduction nature i.e., one of which is electron transporting and the other of which is hole transporting. It is a particular advantage that the position of the junction, which represents the emissive region, in a particular layer or on the interface between two layers provides a means of controlling emission colour, for example the characteristic emissive colour of one of two layers, or of both layers in the form of two colour emission. Preferably a precise junction for coincidence of transported charge is obtained, wherein each conducting layer provides uniform and efficient transport, for the entire layer thickness thereof. This provides a novel means for improving the efficiency and brightness of devices made from existing luminescent polymers, or from novel improved efficiency luminescent polymers alike. Accordingly there is provided according to the present invention a device as hereinbefore defined wherein the junction position may be influenced with resulting property change, and means for influencing the junction position.

Preferably at least one charge semi-conduction layer, or a component thereof, is capable of light emission by luminescence. Preferably the emissive layer(s) or component thereof are substantially coincident with the junction of coincidence of charge carriers. More preferably the or each charge semi-conduction layer is substantially emissive.

The junction position may be influenced by any suitable means. Preferably the junction position is a function of the nature of semi-conducting polymers employed and of the respective thickness of semi-conducting layers employed. It will be appreciated that by appropriate selection of these parameters the respective transport of positive and negative charge carriers (polarons) through the semi-conducting layers may be controlled in manner that sufficient charge coincides at a junction as hereinbefore defined to achieve the external efficiency as hereinbefore defined.

The ratio of thickness may be selected by those skilled in the art, for example by calculation having regard to whether the respective semi-conductors are emissive or non-emissive and the degree of emission, i.e., the quantum efficiency, thereof. Preferably the ratio of thickness are in the region of 0.1–10, more preferably 0.15–9, most preferably 0.3–5, in each case the least thickness layer representing the least efficient charge carrier transporter.

The ratio of thickness may also suitably be determined by experiment, by means of monitoring the brightness and efficiency of electro-luminescence for different ratios of thickness of component semi-conductor layers. For example, by determination of (degree of) luminescence achieved with a device having one semi-conducting layer under test, in combination with a second control semi-conducting layer, only one of each which semi-conducting layers is luminescent, chemical and physical variations of the polymer under test may be made.

Total semi-conducting layer thickness is suitable selected in the range of from 10 to 200 nm, preferably from 30 to 150 nm. Two low a thickness risks entering the range of errors of polymer thickness, whereby short-circuiting may occur at "bald" regions or "pinholes" having substantially no polymer. Excessive thickness requires high voltage operation with resultant power efficiency. Total layer thickness may therefore be selected according to requirements of robustness, cost and quality.

A device as hereinbefore defined may comprise one or more electron transporting and one or more hole transporting layers, preferably comprises one electron transporting and one hole transporting layer.

A component layer as hereinbefore defined adapted for electron injection is suitable comprised of any suitable electron injecting material for example as known in the art, preferably comprises any suitable metal, alloy or semi-conductor such as calcium, magnesium, gold, aluminium and the like optionally as an admixture with suitable agents.

It is a particular advantage that the present invention enables the selection of aluminium as electron injection layer and surprisingly give efficient devices.

A component layer as hereinbefore defined adapted for hole injection is suitably comprised of any suitable hole injecting material for example as known in the art, preferably comprises any suitable metal, alloy or semi-conductor such as indium tin oxide (ITO), tin oxide or other transparent conductor, PEDOT, polyaniline or like polymer, gold and the like, optionally as an admixture with suitable agents.

A component layer as hereinbefore defined adapted for electron transport is suitably comprised of any n-type conducting material for example as known in the art but comprises at least one nitrogen and/or sulphur containing polymer as hereinbefore defined which optionally partly or substantially conjugated, preferably comprises polypyridine (Ppy), polyalkylpyridines, polypyrimidines, polyalkylpyrimidines, polythiazoles, polyalkylthiazoles, derivatives such as fluorinated derivatives, analogues and functional equivalents thereof. Such material may be present in pure form, doped or undoped, protonated or unprotonated, oxidised or reduced or together with suitable agents, for example may be doped by grafting or mixing for property enhancement.

A component layer as hereinbefore defined adapted for hole transport is suitably comprised of any known p-type conducting material for example as known in the art, but which comprise any suitable conjugated organic molecule, dye or dye-doped polymer system, preferably comprises polyparaphenylenevinylene (PPV), poly(2-methoxy-5-(2'-ethyl-hexyloxy)-p-phenylenevinylene) (MEH-PPV), cyano PPV, poly(p-phenylene), poly(alkylthiophene), derivatives, monomers, oligomers, analogues and functional equivalents thereof. Such material may be present in pure form, doped or undoped, protonated or unprotonated, oxidised or reduced or together with suitable agents, for example may be doped by grafting or mixing for property enhancement.

Preferably semi-conducting polymers are substantially uncontaminated by electron and/or "hole" quenching or trapping species which may be reduce their transmission efficiency. For example electron transport and/or hole blocking semi-conducting polymer, preferably polypyridine is most advantageously employed in high purity, preferably in substantially cation free form, wherein cations deriving from the polymerisation reagent employed or the preparation of such reagent are substantially absent as synthetic residue from the polymer structure. More preferably the semi-conducting polymer is prepared by the reaction of precursor monomers and/or oligomers in the presence of a zero-valent chelating metal reagent and a salt of a cation, wherein the zero-valent chelating metal is present in stoichiometric excess to the cation.

Component materials as hereinbefore defined advantageously are characterised by a life time suited to the purpose for which the device is adapted. For example aluminium is characterised by a particular beneficial life time. Polymers are advantageously resistant to photo-oxidation.

The advantages of the present invention, in terms of high efficiency and/or brightness can be enhanced with use of electrodes of relatively high work function and hence good stability.

A device as hereinbefore defined may comprise any further supporting, sealing or protective layers and the like. Preferably a device as hereinbefore defined comprises a transparent rigid or flexible support layer such as quartz or glass or suitable synthetic equivalent such as polymeric substrates on which the device is constructed or onto which the constructed device is transferred, whereby the integrity and uniformity thereof is preserved. A support layer may be used during the construction of the device, onto which either outer layer may be deposited as desired, and intermediate and opposing layers subsequently applied, and a second layer to be used during use applied to either outer layer as desired.

In a further aspect of the invention there is provided the novel use of a semi-conducting polymer in a device as hereinbefore defined. In a particular advantage of the invention it has found that the nitrogen and/or sulphur containing, optionally partially or substantially conjugated polymers as hereinbefore defined are characterised by excellent electron transporting properties, given n-type conduction and improved external quantum efficiency when used as electron transporting layer of an LED or a device as hereinbefore defined. Moreover it has been found that the efficiency thereof may be enhanced by enhancing the synthetic quality thereof. Preferably a semi-conducting polymer for use as an n-type conducting layer in a device as hereinbefore defined comprises polypyridine, more preferably comprises polypyridine which is substantially free of quenches or traps for charge carriers.

In a further aspect of the invention there is provided a process for the preparation of a nitrogen and/or sulphur containing polymer as hereinbefore defined, for example polypyridine, and the polymer obtained, by polymerisation with use of a substantially pure polymerisation reagent, for example a zero-valent nickel polymerisation reagent substantially free of salts of cations for example Zn from $ZnCl_2$. The polypyridine obtained by this process is found to provide excellent purity product polymer.

In a further aspect there is provided an electron transporting and/or hole blocking polymer for use as an n-type semi-conductor, optionally in a device as hereinbefore defined, comprising a nitrogen and/or sulphur containing polymeric material as hereinbefore defined which is preferably substantially free of charge carrier quenching or trapping moieties. More preferably an electron transporting polymeric material is substantially free of materials capable of trapping negative charge or quenching luminescence.

In particular advantage of this aspect of the invention, a highly efficient electron or hole transporting polymeric material may be used in desired purity or thickness to enable the variation of relative degree of electron and hole transport in a semi-conducting device.

In a further aspect of the invention there is provided the use of a device as hereinbefore defined as a light emitting display (LED) of any desired surface area and for portable or fixed purpose. A display may comprise a single continuous device or a mosaic of devices depending on the size and nature thereof. It is a particular advantage of the invention that a device of the invention is characterised by high quality for any application.

Preferably a device is used for display purposes, such as electroluminescent TV or computer screens, back lighting of liquid crystal displays such as in watches and the like, very large area displays such as public information boards in airports and the like, small displays such as for household electrical goods including calculators, washing machines and the like, flexible displays, head-up (virtual reality) displays for training, entertainment purposes and the like, for example for aircraft pilot, road user training and the like; for improved efficiency applications such as for lighting of large areas, preferably by means of panelled low intensity (low brightness) wall or ceiling lighting in place of a plurality of independent lights, lighting powered by a battery source such as car brake lights, lighting in constant use such as traffic lights, warning and or road signs which may be optionally flashing or otherwise active, visible or near infra red security lighting, pulse mode camera flash applications, and the like; and for advanced technology applications such as solid state conjugated polymers lasers, micro cavity LED's enabling modification of wave length and the like; and for application in clothing for safety or fashion purpose.

In further aspect of the invention there is provided the use of a nitrogen and/or sulphur containing polymer as hereinbefore defined as an n-type semi-conductor, for example for use in a semi-conducting electronic device, such as a transistor, solar cell, a photodiode, diode, triode and the like.

In a further aspect of the invention there is provided the use of an efficient electron transporting and/or hole blocking polymer as a component of a semi-conductor or semi-conducting device as hereinbefore defined. It is a particular advantage that the present invention provides a new range of efficient electron transporting polymers, the advantageous properties of which were heretofore unknown, by means of providing the polymer substantially free of materials capable of trapping negative charge or quenching luminescence as hereinbefore defined.

In a further aspect of the invention there is provided a method for the production of a device as hereinbefore defined. A device may suitably be produced by any technique as known in the art. Preferably a device as hereinbefore defined is producing by providing a first support layer of desired dimensions and coating this with successive component layers as hereinbefore defined. Preferably metallic component layers are deposited by electrolytic or reactive means or by evaporation. Preferably a semi-conducting polymer as hereinbefore defined is coated in a layer as hereinbefore defined by means of spin coating or dip-coating of the polymer or a precursor thereof, and optionally curing, or by equivalent high precision technique such as electrochemical deposition or evaporation for providing a polymer film.

Preferably a device as hereinbefore defined comprises or is adapted to be associated with means for mounting and operation thereof in known manner. It is a particular advantage that devices of the invention may be viewed from a large range of angles simplifying their mounting, and greatly improving their visibility. It is a further advantage that the devices may be used to provide a rapid response for pulse operation. Devices may be used in AC or DC operation, with the hereinbefore mentioned advantages of power consumption supply and brightness.

In a further aspect of the invention there is provided a method for the operation of light emitting diode as hereinbefore defined. Suitably a light emitting diode as hereinbefore defined is operated in known manner, by applying voltage, causing a current to flow through the device. Advantageously a device as hereinbefore defined may be conveniently and reliably operated by virtue of the high external quantum efficiency thereof.

The invention is now illustrated in non limiting manner with reference to the following figures and examples.

Figure 3:
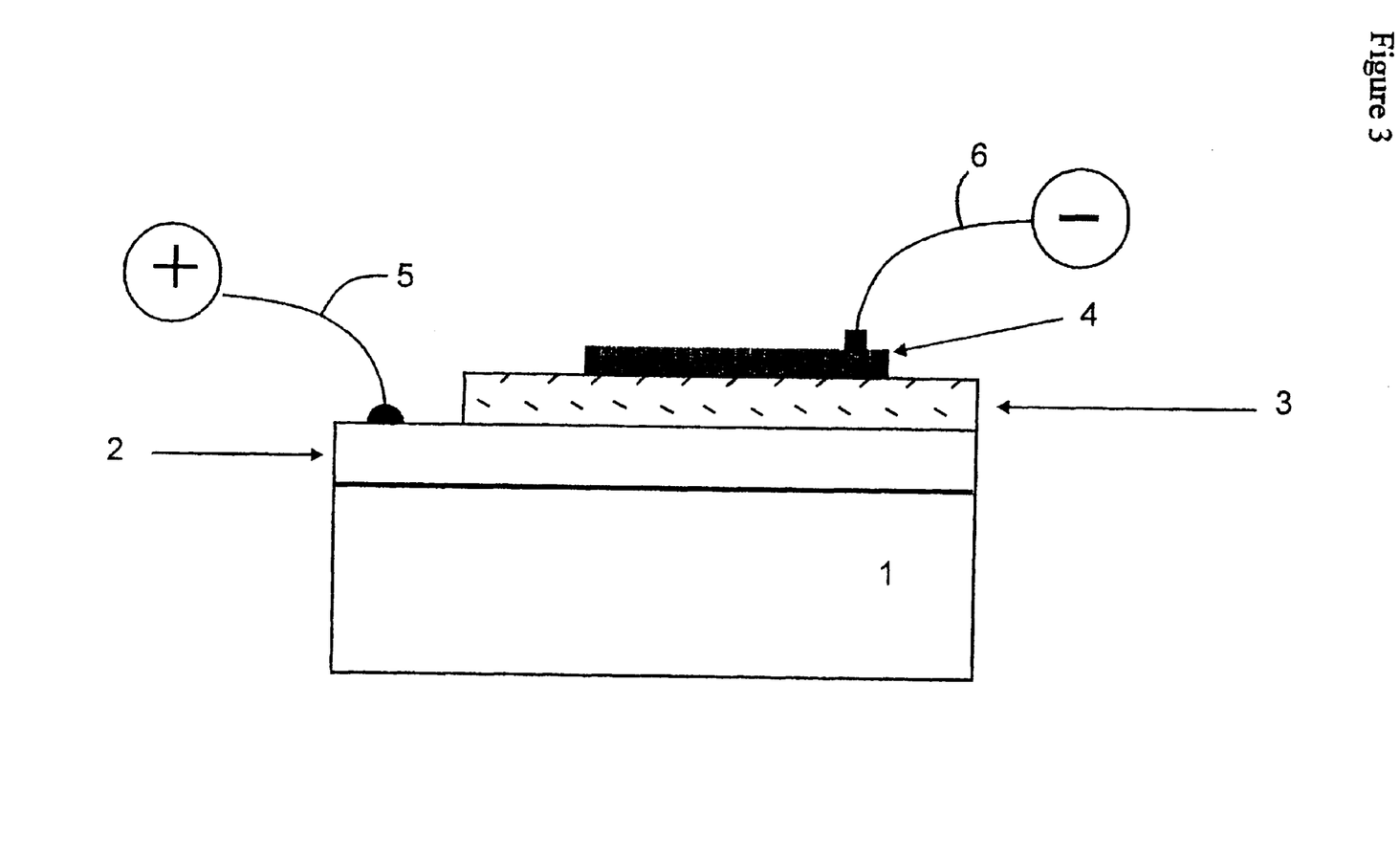
FIG. 3 illustrates the construction of an LED device as known in the art.

The construction of a typical electrode/polymer/electrode device is illustrated in FIG. 3. A high work function electrode such an indium-tin oxide (ITO) (4.6 eV), deposited on a glass substrate (1) serves as the anode (2) and is semi-transparent at thickness of 7–10 nm. The precursor of polymer, such as PPV is deposited as a thin film on the electrode and, converted into the conjugated material, thereby providing semi-conducting polymer layer (3). A low work function metal, such as calcium or aluminium is evaporated onto the polymer surface (3) by a vacuum metal vapour deposition, and serves as the cathode (4). Electrical contacts are provided (5, 6) linking the anode (2) and cathode (4) to a suitable power supply (not shown). In order to achieve charge injection, high field strengths (of the order of $10^6$V/cm) are required, although with the use of thin films of the order of 100 nm, the forward bias voltage of the device can be as low as a few volts.

Figure 4:
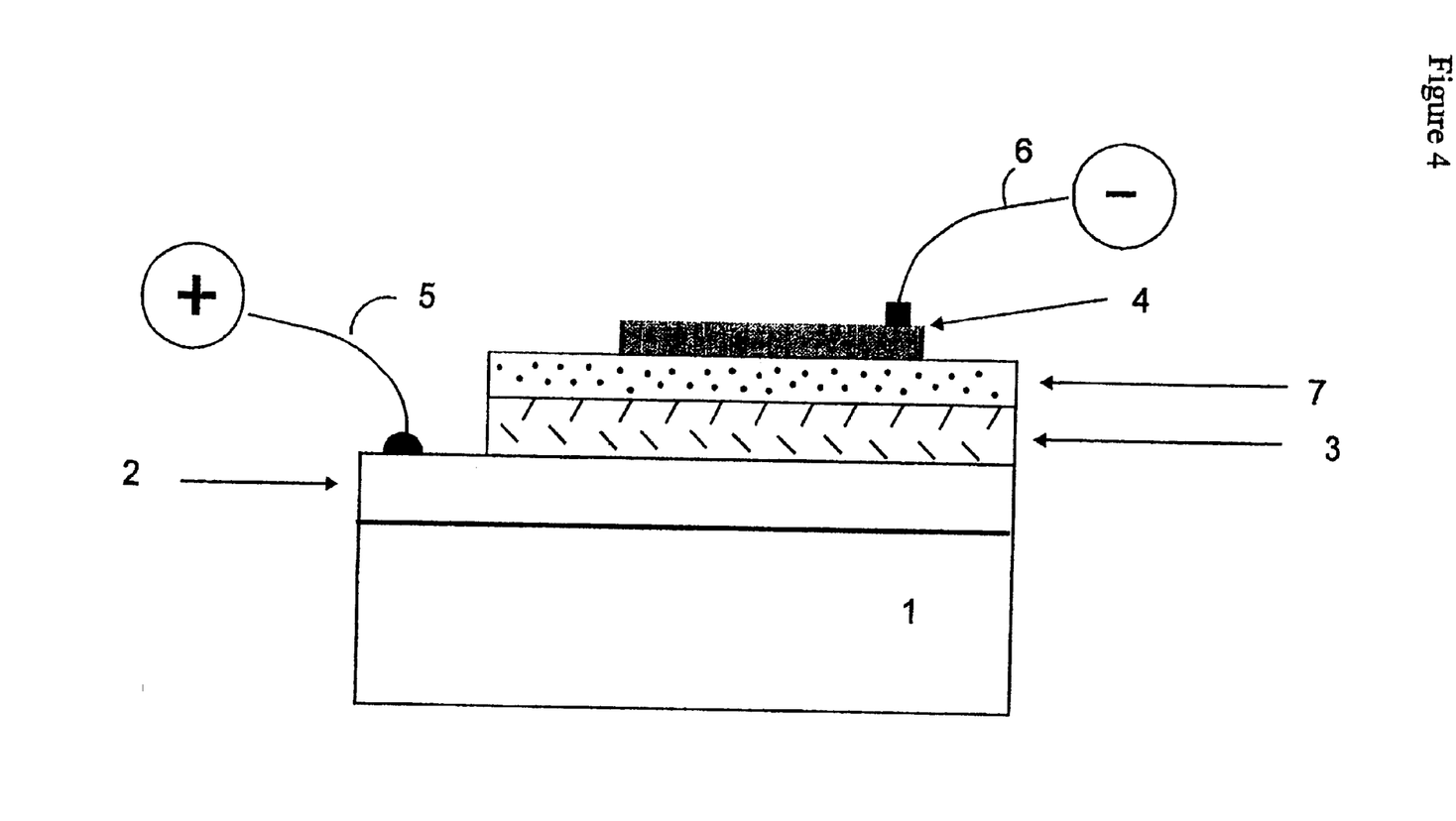
FIG. 4 illustrates an LED comprising a device according to the invention.

In FIG. 4 is shown the construction of an electrode/polymer/electrode device according to the invention. The device comprises the same component parts as indicated for FIG. 3, optionally comprising a plurality of semi-conducting polymer layers. For the purpose of illustration, FIG. 4 shows a layer (3), such as PPV as described with reference to FIG. 3, and additionally a semi-conducting polymer layer (7), such as polypyridine (Ppy) directly deposited from a solution of Ppy as the polymer, as a thin film on the pre-prepared PPV layer (3). The respective thickness of layer (3) and (7) is as hereinbefore defined. For a first illustrative purpose layer (3) is of the order 120 nm and layer (7) is the order of up to 40 nm, thereby having a thickness ratio of 3. For a second illustrative purpose layer (3) is of the order of 90 nm and layer (7) is of the order of 50 nm, thereby having a thickness ratio of 1.8. The device of FIG. 4 may be operated at field strengths of the order of $10^6$V/cm in order to achieve charge injection. The forward bias voltage of the device may be of the order of 2–20 V depending on layer thickness.

Figure 5:
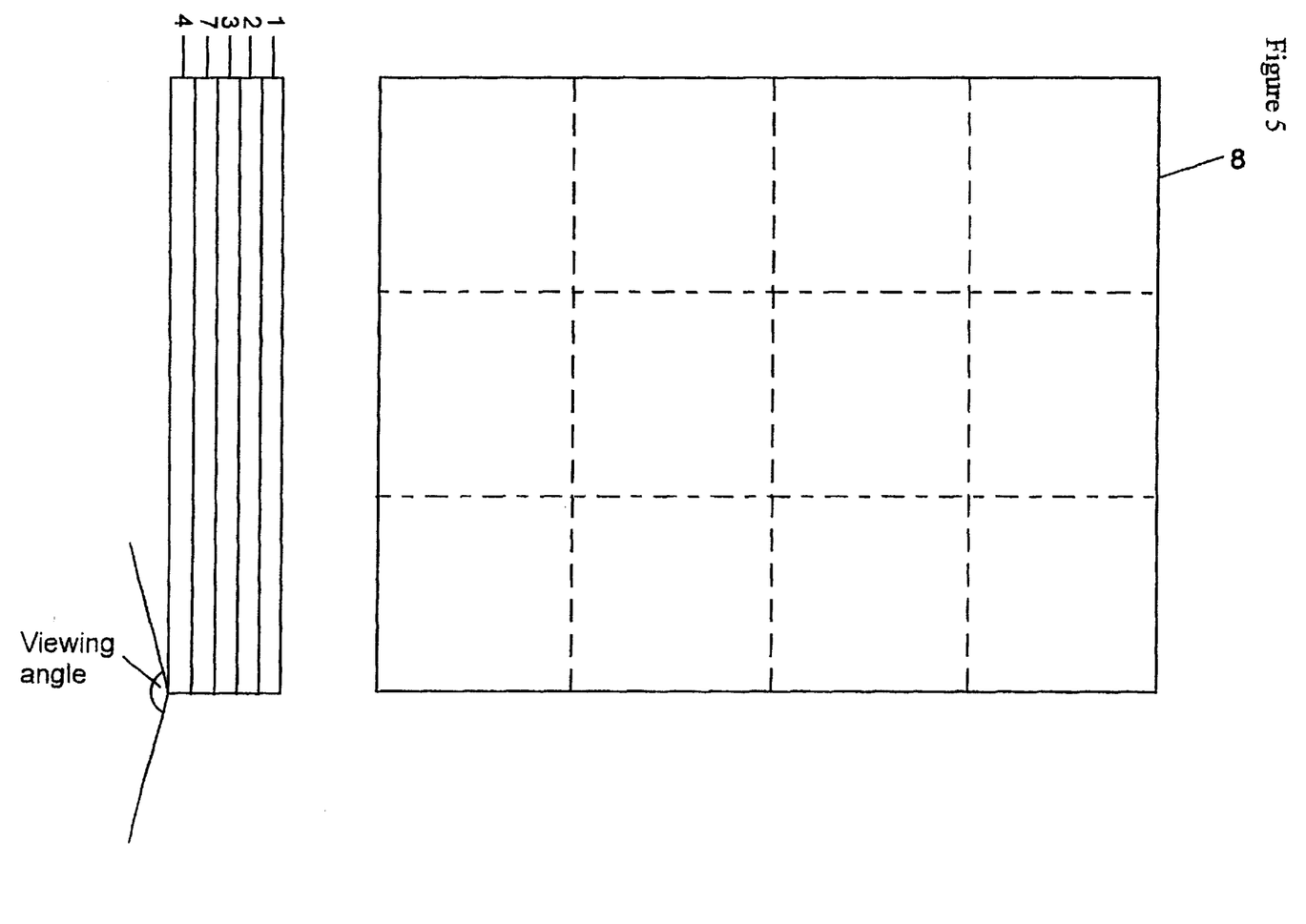
FIG. 5 illustrates a display screen comprising the device of FIG. 2.

In FIG. 5 is illustrated an outdoor display screen which comprises the device of FIG. 4 of which the layers are continuous throughout the cross-section area of the screen (8), or as repeating sub-units of continuous layers (indicated as dotted lines). The front panel of the display comprises a glass substrate layer (1) as hereinbefore described for FIG. 4, or a suitable transparent material having mechanical properties adapted to resist deformation and fracture, and having a refractive index suited for the designed light emission properties.

The device of FIG. 4, having a thickness ratio of 1.8 providing an external quantum efficiency of greater than or equal to 0.2% and brightness of the order of 1100 Cd/m$^2$ in continuous wave operation, or brighter in pulsed operation may be visible from a distance, depending on the colour of visible light emission, detail and clarity of the image or message being portrayed. This compares with an inferior range for a similar image or message portrayed on a screen constructed of the device of FIG. 3, having an external quantum efficiency of the order of 0.01% or less and brightness of the order of tens of Cd/m$^2$.

EXAMPLE 1

Preparation of a Device of the Invention

A glass or quartz surface of thickness of the order of 1 mm, coated with ITO to a thickness of 80 nm+/−15 nm was used as the support for component layers of the device as hereinbefore defined, commercially available (Balzers 30 Ohms per square). PPV precursor polymer comprising the tetrahydrothiophenium (THT) leaving group as a solution in methanol was spin coated to a thickness of 100 nm onto the glass/ITO substrate, and converted to PPV by heating at 250° C. for ten hours under dynamic vacuum. A Ppy layer comprising the polymer in solution prepared by dissolving Ppy powder in 97% formic acid was spin coated directly onto the PPV layer to form a homogeneous thin film requiring no thermal conversion, and of a thickness of up to 100 nm+/−5 nm. The cathode comprising aluminium was coated onto the Ppy layer by evaporation at a pressure of $5 \times 10^{-6}$ mbar, at a rate of 0.1–0.5 nms$^{-1}$.

Ppy powder used in the preparation of the device was prepared by conventional technique but modified with use of a nickel catalyst, in controlled fashion. The product polymer obtained by this novel modified process was substantially uncontaminated by cations of salt components employed in the catalyst preparation, such as zinc, which may operate as a trap or quench in disadvantageous manner as hereinbefore defined.

The purity of the polymer may be selected as appropriate, for example the photoluminescence quantum yield gives one measure of the purity of the material.

EXAMPLE 2

Electro Luminescence of a Device of the Invention

Figure 6:
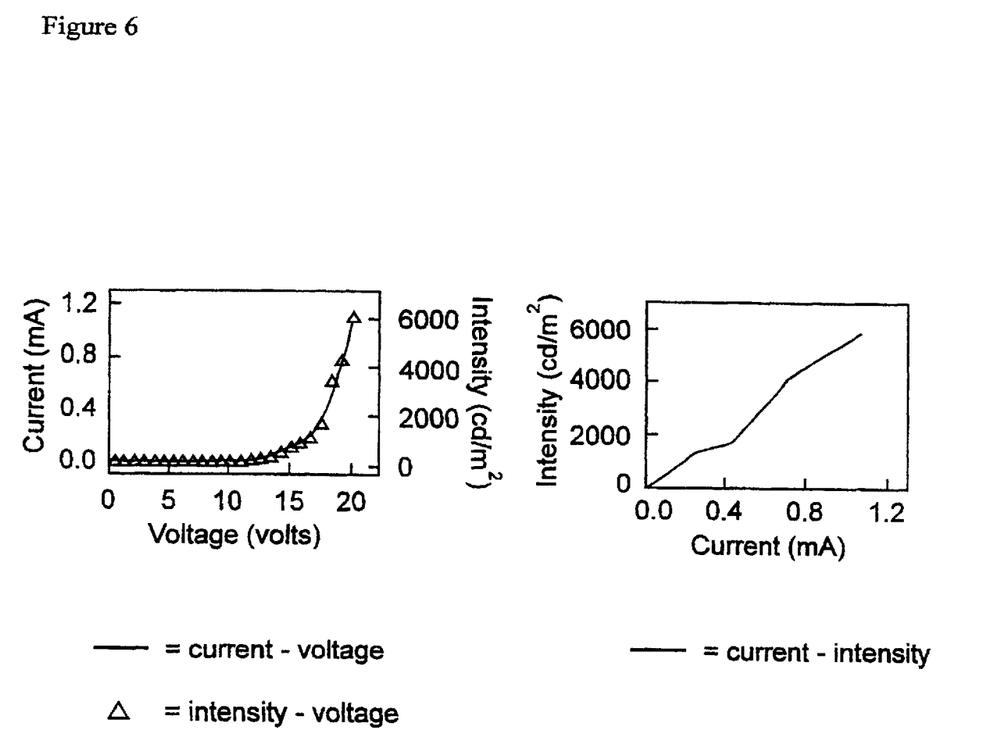
FIG. 6 illustrates the current voltage—light output characteristic of the device of FIG. 4.

The device prepared according to Example 1 was connected to a suitable power supply by electrical contacts placed at the ITO anode and the Al cathode. The device was operated at a turn-on voltage of 12V and current-voltage and current-intensity measurements carried out. From the data obtained and indicated in FIGS. 6 and 7, the external quantum efficiency was determined.

The results are shown in Table 1.

EXAMPLE 3

Preparation of a Device of the Invention

A device according to the invention was prepared using the method of Example 1 but employing MEH-PPV as the emissive layer, prepared from the appropriate precursor.

EXAMPLE 4

Electro Luminescence of a Device of the Invention

The device prepared according to Example 3 was connected and operated as described in Example 2. The results are shown in Table 1.

EXAMPLE 5

Electro Luminescence of a Device not according to the Invention

Comparative devices were prepared using known techniques, and as hereinbefore defined, comprising the device of FIG. 1, and the device of FIG. 2 having inefficient layer thickness ratio. The process of Example 2 was employed and the same measurements were conducted as described for Example 2 and external efficiency data were determined.

Figure 7:
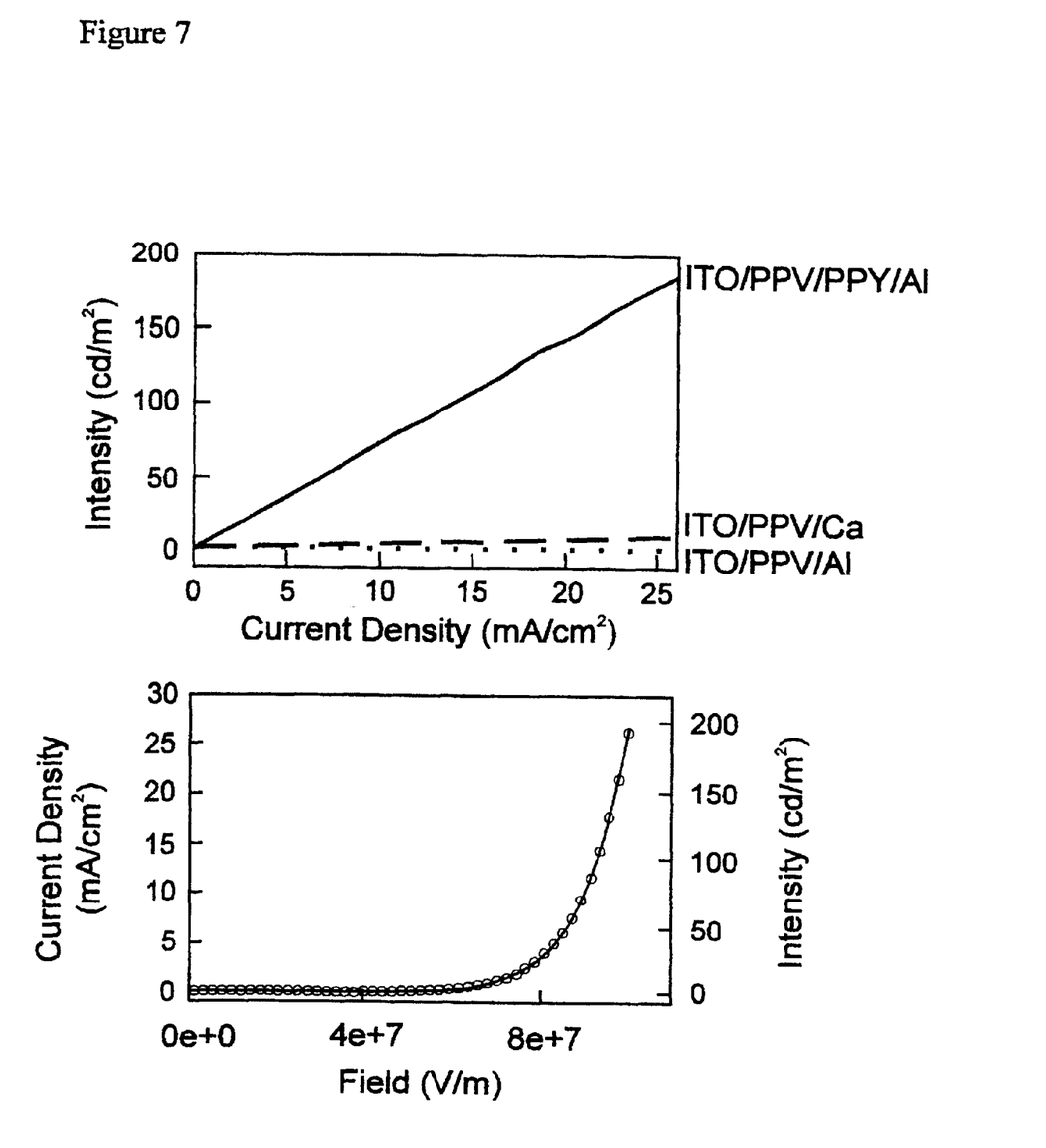
FIGS. 7 and 8 illustrate the light output—current characteristic of devices of FIG. 4 and devices of FIG. 3.

The results are shown in Table 1 and FIG. 7

TABLE 1

| DEVICE | SEMI-CONDUCTING POLYMER THICKNESS (PPV/PPY RATIO) | EXTERNAL QUANTUM EFFICIENCY |
|---|---|---|
| ITO/PPV/Ppy/Al | 140 nm (1.8) | 0.25% |
| ITO/PPV/Ppy/Al | 160 nm (1.66) | 0.21% |
| ITO/PPV/Ppy/Al | 160 nm (0.33) | 0.004% |
| ITO/PPV/Al | 140 nm (–) | 0.004% |
| ITO/PPV/Ca | 120 nm (–) | 0.01% |
| ITO/MEH-PPV/Ppy/Al | 250 nm (1.0) | 0.04% |
| ITO/MEH-PPV/AL | 110 nm (–) | 0.009% |

It will be appreciated that the accuracy of layer thickness is a function of the materials employed, the techniques for preparation and the skill and apparatus available, however layer thickness of spin coated polymers obtained directly from solution as hereinbefore defined are generally prepared to an accuracy of +/–5 nm. Deviations in thickness across a device as hereinbefore defined may contribute to inhomogeneity of the electric field in the device whereby some reduction in efficiency, uniformity and lifetime may be observed.

From Table 1 it is clear that:
(i) the bilayer device with PPY and PPV with optimised thickness ratio (top row) is 60 times more efficient than a similar device without the polypyridine layer ($4^{th}$ row)
(ii) the bilayer device is also much more efficient than a single layer device with a calcium contract ($5^{th}$ row)
(iii) bilayer MEH-PPV devices ($6^{th}$ row) are a factor of 4 more efficient than similar devices without the polypyridine layer ($7^{th}$ row). The results demonstrate a substantial improvement in efficiency with both PPV and MEH-PPV as the emissive layers, which may be expected to apply also with a wide range of existing (or future) luminescent materials. Without being limited to this theory the magnitude of increase efficiency is thought to be proportional to the barrier to electron injection for example in MEH-PPV.

With reference to Table 1 it will be apparent that the appropriate selection of respective layer thickness for a given device comprising positive and negative charge conducting polymers has a dramatic effect on the efficiency of the device. Moreover it will be appreciated that polymers, previously considered to be essentially non-conducting, may be rendered conducting in admirable manner by careful control of the synthesis thereof, in particular with reference to the synthesis of Ppy.

Figure 8:
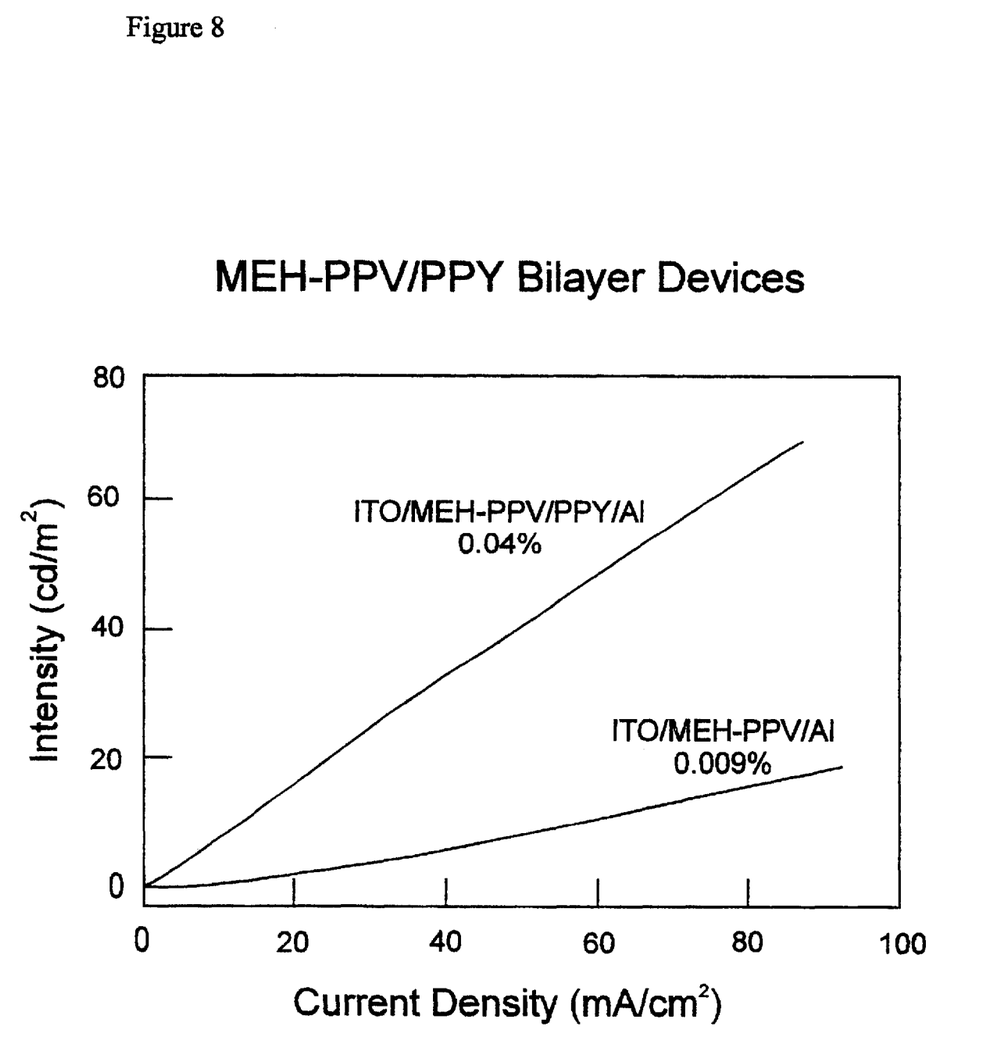

With reference to FIGS. 7 and 8, in which the slope of the figures for devices according to the invention and not according to the invention, is proportional to the external quantum efficiency, the distinction is very clearly indicated in terms of the dramatically higher external quantum efficiency of the device according to the invention, and as illustrated in FIG. 4, compared with the device not according to the invention, and as illustrated in FIG. 3.

The upper FIG. 7 shows the intensity-current density characteristics of bilayer and single layer diodes. The solid line shows the behaviour of a bilayer PPV/PPY diode of thickness 140 nm and a PPY:PPY thickness ratio of 1.8. The dashed line shows the results for a 120 nm thick PPV device with calcium electrodes. The dotted line shows the results for a 140 nm thick PPV device with aluminium contracts. The external quantum efficiency of each diode is proportional to the slope of each curve. The bilayer diode has an efficiency of 0.25%, much higher than the efficiency of 0.01% for the PPV/Ca diode and 0.004% for the PPV/Al diode.

The lower FIG. 7 shows the current density-field (line) and intensity-field (symbols) characteristics of the bilayer diode. The current density shows typical diode field dependence.

The FIG. 8 shows intensity-current density characteristics of bilayer and single layer MEH-PPV/PPY and MEH-PPV diodes. The bilayer diode has an efficiency of 0.04%, much higher than the single layer diode efficiency of 0.009%.

Figure 9:
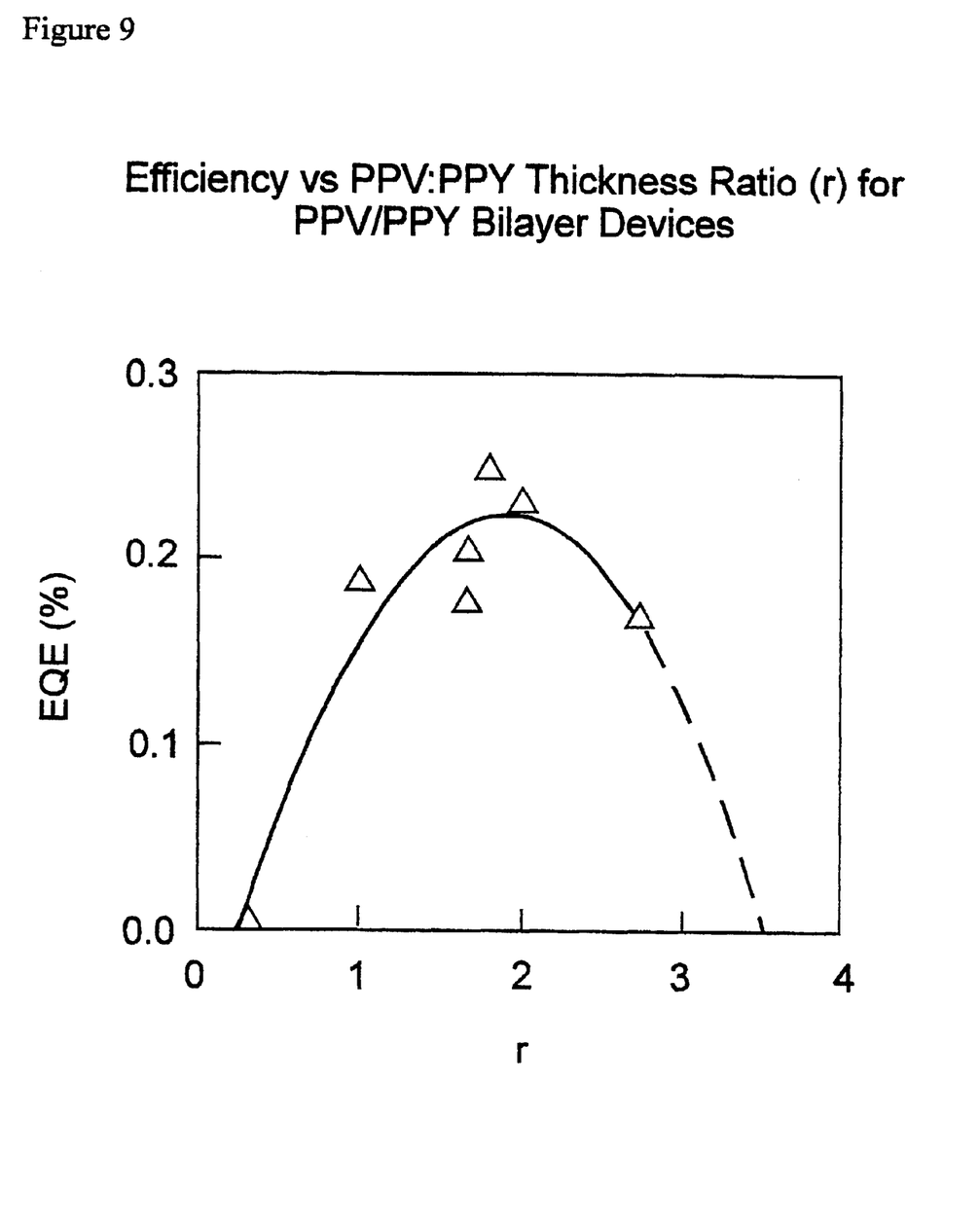
FIG. 9 illustrated the efficiency—thickness ratio characteristic of a bilayer device of the invention.

The FIG. 9 shows efficiency vs thickness ratio characteristics for bilayer diodes. The figure shows that maximum efficiencies are achieved for an optimum ratio of thickness, which coincides with balanced electron and hole transport which is thought to coincide at a junction, within the layer capable of light emission by luminescence.

Further advantages of the invention will be apparent from the foregoing.

What is claimed is:

1. Device for use in efficient light emission comprising a plurality of component layers of which a first outer layer is used for electron injection, a second opposing outer layer is used for "hole" injection, and at least two intermediate layers arranged therebetween are used for charge semi-conduction, wherein the intermediate layers to comprise semi-conducting polymer materials coated in layers by spin coating or dip coating of the polymer or a precursor thereof, and comprise at least one semi-conductor polymer used for electron transport and/or hole blocking, and at least one semi-conductor polymer used for hole transport and/or electron blocking, wherein the at least one semi-conducting polymer used for electron transport and/or hole blocking comprises polymer selected from a nitrogen and/or sulphur containing polymer which is partially or substantially conjugated, wherein ratio of thickness of semi-conducting polymer layers are in the regionof 0.1–10, the least thickness layer representing the least efficient charge semi-conductor.

2. Device as claimed in claim 1 wherein the migration and coincidence of electrons and/or "holes" is adapted to be manipulated by means of controlling layer thickness, to create a boundary region of coincidence of negative and positive charge carriers, hereinafter a junction, positioned relative to the first and second outer layers in an emissive region in manner to provide enhanced brightness and/or external quantum efficiency.

3. Device as claimed in any of claim 1 wherein the at least one semi-conducting polymer adapted for electron transport and/or hole blocking is selected from a conjugated polycyclic in which at least one nitrogen and/or sulphur is a heteroatom comprised within a conjugated heterocyclic system.

4. Device as claimed in claim 1 wherein the junction coincides with or bridges the interface between two semi-conducting layers, which are of different charge semi conduction nature.

5. Device as claimed in claim 1 wherein at least one charge semi-conduction layer or a component thereof, is additionally capable of light emission by electroluminescence.

6. Device as claimed in claim 5 wherein the at least one charge semi-conduction layer or a component thereof, which is additionally capable of light emission by electroluminescence, is substantially coincident with the junction of coincidence of charge carriers.

7. Device as claimed in claim 1 wherein the ratio of thickness of semi-conducting layers are in the region of 0.15–9, the least thickness layer representing the least efficient charge semi-conductor.

8. Device as claimed in claim 1 wherein a component layer adapted for electron injection comprises a metal selected from calcium, magnesium, gold, or aluminium, optionally as an admixture with suitable agents.

9. Device as claimed in claim 1 wherein a component layer adapted for hole injection is comprised of a hole injection material, selected from a metal, alloy, or semi-conductor such as indium tin oxide (ITO), tin oxide, as a transparent conductor, PEDOT, polyaniline or like polymer, gold, and admixtures thereof with suitable agents.

10. Device as claimed in claim 1 wherein a component layer adapted for electron transport and/or hole blocking is comprised of a n-type conducting nitrogen and/or sulphur containing polymer as hereinbefore defined in claim 1 or 2 selected from the group consisting of polypyridine (Ppy), polyalkylpyridines, polypyrimidines, polyalkylpyrimidines, polythiazoles, polyalkylthiazoles, derivatives such as fluorinated derivatives, analogues and functional equivalents thereof.

11. Device as claimed in claim 1 wherein electron transport and/or hole blocking semi-conductor polymer is substantially uncontaminated by electron quenching or trapping species and hole transport and/or electron blocking semi-conducting polymer is substantially uncontaminated by hole quenching or trapping species.

12. Device as claimed in claim 11 wherein the electron transport and/or hole blocking semi-conductor polymer is of high purity, is in substantially cation free from, wherein cations deriving from polymerisation reagent employed or the preparation of such reagents are substantially absent as synthetic residue from the polymer structure.

13. Device as claimed in claim 1 wherein the hole transport and/or electron blocking polymer is comprised of any p-type conducting material, which is a conjugated organic molecule, dye or dye-doped polymer system polyparaphenylenevinylene (PPV), poly(2methoxy-5-(2'-ethyl-hexyloxy)-p-phenylenevinylene) (MEM-PPV), cyano PPV, poly(p-phenylene), poly(alkylthiophene), derivatives, monomers, oligomers, analogues and functional components thereof.

14. Device as claimed in claim 1 wherein comprises a further supporting, sealing or protective layer.

15. A device as claimed in claim 1 for use in a light emitting display (LED) of any desired surface area for portable or fixed purpose.

16. A method for the production of a device as claimed in claim 1 comprising providing a first support layer of desired dimensions and coating this with successive component layers as hereinbefore defined.

17. Method for the operation of a light emitting diode comprising a device as defined in claim 1, comprising applying a voltage and causing a current to flow through the device.

18. Device as claimed in claim 1 wherein ratio thickness of semi-conducting layers is 0.3–5, the least thickness layer representing the least efficient charge semi-conductor.

19. Device as claimed in claim 13 wherein the hole transport and/or electron blocking polymer is comprised of polyparaphenylenevinylene (PPV), poly(2-methoxy-5-(2'-ethyl-hexyloxy)-p-phenylenevinylene) (MEM-PPV), cyano PPV, poly(p-phenylene), poly(alkylthiophene), derivatives, monomers, oligomers, analogues and functional components thereof.

* * * * *